US011145682B2

United States Patent
Yu et al.

(10) Patent No.: US 11,145,682 B2
(45) Date of Patent: Oct. 12, 2021

(54) ARRAY SUBSTRATE AND METHOD FOR FABRICATING THE SAME, DISPLAY PANEL, DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Yanan Yu, Beijing (CN); Jingyi Xu, Beijing (CN); Yanwei Ren, Beijing (CN); Xin Zhao, Beijing (CN); Xiaokang Wang, Beijing (CN); Yuelin Wang, Beijing (CN); Huijie Zhang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 27 days.

(21) Appl. No.: 16/621,325

(22) PCT Filed: Mar. 13, 2019

(86) PCT No.: PCT/CN2019/077903
§ 371 (c)(1),
(2) Date: Dec. 11, 2019

(87) PCT Pub. No.: WO2019/179339
PCT Pub. Date: Sep. 26, 2019

(65) Prior Publication Data
US 2020/0168639 A1    May 28, 2020

(30) Foreign Application Priority Data
Mar. 23, 2018 (CN) .......................... 201810247221.7

(51) Int. Cl.
*H01L 27/12* (2006.01)
*H01L 29/786* (2006.01)

(52) U.S. Cl.
CPC ...... *H01L 27/1244* (2013.01); *H01L 27/1248* (2013.01); *H01L 27/1288* (2013.01); *H01L 29/78633* (2013.01)

(58) Field of Classification Search
CPC ............. H01L 27/1244; H01L 27/1248; H01L 27/1288; H01L 27/1259; H01L 29/78633; G02F 1/1345
See application file for complete search history.

(56) References Cited

U.S. PATENT DOCUMENTS 5,721,164 A     2/1998   Wu
6,627,470 B2 *  9/2003   Yoo ........................ G02F 1/1368
                                                           257/250
(Continued)

FOREIGN PATENT DOCUMENTS

CN    1519955 A    8/2004
CN    1610111 A    4/2005
(Continued)

OTHER PUBLICATIONS

First Office Action for Chinese Patent Application No. 201810247221.7 dated Sep. 3, 2019.
(Continued)

*Primary Examiner* — Sitaramarao S Yechuri
(74) *Attorney, Agent, or Firm* — Calfee, Halter & Griswold LLP

(57) ABSTRACT

An array substrate which includes a display region and a peripheral region surrounding the display region, the peripheral region includes a data line lead region and a driving circuit region, and the data line lead region is between the driving circuit region and the display region; the driving
(Continued)

circuit region includes a driving circuit, the data line lead region includes a the plurality of data line leads, and the plurality of data line leads extend from the display region and are electrically connected with the driving circuit; and the data line lead region includes peripheral data line leads, a region of the peripheral region close to the peripheral data line leads includes at least one retaining wall configured to prevent plasma from affecting the peripheral data line leads. A method for fabricating an array substrate, a display panel, and a display device are also disclosed.

20 Claims, 7 Drawing Sheets

(56) References Cited

U.S. PATENT DOCUMENTS

| | | | | |
|---|---|---|---|---|
| 6,806,500 | B2* | 10/2004 | Kawata | G02F 1/136286 257/72 |
| 2004/0224241 | A1 | 11/2004 | Park et al. | |
| 2005/0104069 | A1 | 5/2005 | Jun et al. | |
| 2008/0012139 | A1 | 1/2008 | Ryu et al. | |
| 2010/0133990 | A1* | 6/2010 | Park | H01L 27/3276 313/504 |
| 2010/0156945 | A1* | 6/2010 | Yoshida | G02F 1/1345 345/690 |
| 2010/0230682 | A1* | 9/2010 | Song | H01L 27/1248 257/59 |
| 2011/0012123 | A1* | 1/2011 | Seong | G02F 1/1345 257/59 |
| 2014/0017838 | A1* | 1/2014 | Song | H01L 27/1248 438/34 |
| 2017/0062487 | A1 | 3/2017 | Zou et al. | |
| 2017/0221938 | A1 | 8/2017 | Cai et al. | |
| 2019/0252413 | A1 | 8/2019 | Xu et al. | |

FOREIGN PATENT DOCUMENTS

| | | |
|---|---|---|
| CN | 101393363 A | 3/2009 |
| CN | 104867940 A | 8/2015 |
| CN | 105655295 A | 6/2016 |
| CN | 107527894 A | 12/2017 |
| CN | 108305881 A | 7/2018 |
| CN | 207924332 U | 9/2018 |

OTHER PUBLICATIONS

Second Office Action for Chinese Patent Application No. 201810247221.7 dated Mar. 24, 2020.

* cited by examiner

ARRAY SUBSTRATE AND METHOD FOR FABRICATING THE SAME, DISPLAY PANEL, DISPLAY DEVICE

RELATED APPLICATIONS

The present application is the U.S. national phase entry of PCT/CN2019/077903, with an international filing date of Mar. 13, 2019, which claims the benefit of Chinese Patent Application No. 201810247221.7, filed Mar. 23, 2018, the entire disclosures of which are incorporated herein by reference.

TECHNICAL FIELD

The present disclosure relates to the field of display technologies, and particularly to an array substrate, a method for fabricating the same, a display panel, and a display device.

BACKGROUND

With the development of display technologies, a narrow bezel technology has become the main developing trend of the existing display technologies. However, when the bezel of a product becomes narrower, it is required that thinner and denser wires shall be arranged on an array substrate. When wires are formed in a source/drain (SD) layer of the narrow bezel product, both the critical dimension (CD) and the space of data lines in fanout region are relatively small. This tends to introduce defects like weak connection or even disconnection of the circuit, an open circuit, a display dark line, or the like, which can cause a certain decrease of the yield.

SUMMARY

In an exemplary embodiment, there is provided an array substrate, comprising a display region and a peripheral region surrounding the display region, wherein the peripheral region comprises a data line lead region and a driving circuit region, and the data line lead region is between the driving circuit region and the display region;

wherein the driving circuit region comprises a driving circuit, the data line lead region comprises a plurality of data line leads, and the plurality of data line leads extend from the display region and are electrically connected with the driving circuit; and wherein the data line lead region comprises peripheral data line leads, a region of the peripheral region close to the peripheral data line leads comprises at least one retaining wall configured to prevent plasma from affecting the peripheral data line leads.

In an exemplary embodiment, the at least one retaining wall comprises two retaining walls which are arranged oppositely.

In an exemplary embodiment, the array substrate further comprises a base substrate and an interlayer dielectric layer on a side of the base substrate, wherein the retaining wall is arranged in a same layer and made of a same material as the interlayer dielectric layer, and a height of the retaining wall in a direction perpendicular to the base substrate is larger than a height of the interlayer dielectric layer in the direction perpendicular to the base substrate.

In an exemplary embodiment, the data line leads are arranged on a surface of the interlayer dielectric layer away from the base substrate, and the height of the retaining wall in the direction perpendicular to the base substrate is not smaller than a sum of the height of the interlayer dielectric layer and a height of the data line leads in the direction perpendicular to the base substrate.

In an exemplary embodiment, the array substrate further comprises a base substrate, an interlayer dielectric layer on a side of the base substrate, and a gate layer between the base substrate and the interlayer dielectric layer, wherein the retaining wall is arranged in a same layer and made of a same material as the gate layer, and a sum of a height of the interlayer dielectric layer and a height of the retaining wall in the direction perpendicular to the base substrate is larger than a sum of the height of the interlayer dielectric layer and a height of the gate layer in the direction perpendicular to the base substrate.

In an exemplary embodiment, the array substrate further comprises a base substrate, and a gate insulating layer, a gate layer, and an interlayer dielectric layer which are arranged away from the base substrate in this order, wherein the retaining wall is arranged in a same layer and made of a same material as the gate insulating layer, and a sum of a height of the interlayer dielectric layer, a height of the gate layer, and a height of the retaining wall in the direction perpendicular to the base substrate is larger than a sum of the height of the interlayer dielectric layer, the height of the gate layer, and a height of the gate insulating layer in the direction perpendicular to the base substrate.

In an exemplary embodiment, the array substrate further comprises a base substrate, and a light shield layer, a gate insulating layer, a gate layer, and an interlayer dielectric layer which are arranged away from the base substrate in this order, wherein the retaining wall is arranged in a same layer and made of a same material as the light shield layer, and the sum of a height of the interlayer dielectric layer, a height of the gate layer, a height of the gate insulating layer and the height of the retaining wall perpendicular to the base substrate is larger than the sum of the height of the interlayer dielectric layer, the height of the gate layer, the height of the gate insulating layer, and a height of the light shield layer perpendicular to the base substrate.

In an exemplary embodiment, the array substrate further comprises a dummy SD, wherein the dummy SD is arranged on a side of the interlayer dielectric layer away from the base substrate, and the dummy SD is between the retaining wall and the data line leads.

In an exemplary embodiment, a space between the retaining wall and the dummy SD equals to a space between the data line leads.

In an exemplary embodiment, a space between the retaining wall and the dummy SD is about 2.0 μm~2.5 μm.

In an exemplary embodiment, the retaining wall has a width of about 2.5 μm~20 μm.

In an exemplary embodiment, the retaining wall has a width of about 2.5 μm, and the data line leads have a width of 2.5 μm.

In another exemplary embodiment, there is provided a method for fabricating an array substrate, wherein the array substrate comprises a display region and a peripheral region surrounding the display region, wherein the peripheral region comprises a data line lead region and a driving circuit region, and the data line lead region is between the driving circuit region and the display region; wherein the driving circuit region comprises a driving circuit, the data line lead region comprises a plurality of data line leads, and the plurality of data line leads extend from the display region and are electrically connected with the driving circuit; wherein the data line lead region comprises peripheral data line leads, and the method comprises: forming at least one retaining wall in a region of the peripheral region close to the peripheral data line leads, and wherein the at least one retaining wall is configured to prevent plasma from affecting the peripheral data line leads.

In an exemplary embodiment, the step of forming at least one retaining wall in the region of the peripheral region close to the peripheral data line leads comprises: forming two retaining walls which are arranged oppositely, in the region of the peripheral region close to the peripheral data line leads.

In an exemplary embodiment, the step of forming at least one retaining wall in the region of the peripheral region close to the peripheral data line leads comprises:
preparing a base substrate,
forming an interlayer dielectric thin film on the base substrate, and
patterning the interlayer dielectric thin film by using a half tone mask, to form the retaining wall and an interlayer dielectric layer, wherein a height of the retaining wall in a direction perpendicular to the base substrate is larger than a height of the interlayer dielectric layer in the direction perpendicular to the base substrate.

In an exemplary embodiment, the method further comprises:
forming the data line leads on a surface of the interlayer dielectric layer away from the base substrate, wherein the height of the retaining wall in the direction perpendicular to the base substrate is not smaller than a sum of the height of the interlayer dielectric layer and a height of the data line leads in the direction perpendicular to the base substrate.

In an exemplary embodiment, the step of forming at least one retaining wall in the region of the peripheral region close to the peripheral data line leads comprises:
preparing a base substrate,
forming a gate thin film on the base substrate,
patterning the gate thin film by using a half tone mask, to form the retaining wall and the gate layer, and
forming an interlayer dielectric layer on the retaining wall and the gate layer, wherein a sum of a height of the interlayer dielectric layer and a height of the retaining wall in the direction perpendicular to the base substrate is larger than a sum of the height of the interlayer dielectric layer and a height of the gate layer in the direction perpendicular to the base substrate.

In an exemplary embodiment, the step of forming at least one retaining wall in the region of the peripheral region close to the peripheral data line leads comprises:
preparing a base substrate,
forming a gate insulating thin film on the base substrate,
patterning the gate insulating thin film by using a half tone mask, to form the retaining wall and the gate insulating layer, and
forming a gate layer and an interlayer dielectric layer in this order on the retaining wall and the gate insulating layer, wherein a sum of a height of the interlayer dielectric layer, a height of the gate layer, and a height of the retaining wall in the direction perpendicular to the base substrate is larger than a sum of the height of the interlayer dielectric layer, the height of the gate layer, and a height of the gate insulating layer in the direction perpendicular to the base substrate.

In an exemplary embodiment, the step of forming at least one retaining wall in the region of the peripheral region close to the peripheral data line leads comprises:

preparing a base substrate,
forming a light shield thin film on the base substrate,
patterning the light shield thin film by using a half tone mask, to form the retaining wall and light shield layer,
forming a gate insulating layer, a gate layer, and an interlayer dielectric layer in this order on the retaining wall and the light shield layer, wherein a sum of a height of the interlayer dielectric layer, a height of the gate layer, a height of the gate insulating layer and a height of the retaining wall perpendicular to the base substrate is larger than a sum of the height of the interlayer dielectric layer, the height of the gate layer, the height of the gate insulating layer, and a height of the light shield layer perpendicular to the base substrate.

In an exemplary embodiment, the method further comprises forming a dummy SD on a side of the interlayer dielectric layer away from the base substrate, wherein the dummy SD is between the retaining wall and the data line leads.

In an exemplary embodiment, a space between the retaining wall and the dummy SD equals to a space between the data line leads.

In an exemplary embodiment, a space between the retaining wall and the dummy SD is about 2.0 μm~2.5 μm.

In an exemplary embodiment, the retaining wall has a width of about 2.5 μm~20 μm.

In an exemplary embodiment, the retaining wall has a width of about 2.5 μm, and the data line leads have a width of 2.5 μm.

In another exemplary embodiment, there is provided a display panel, comprising the array substrate as described above.

In yet another exemplary embodiment, there is provided a display device, comprising the array substrate as described above.

BRIEF DESCRIPTION OF THE DRAWINGS

FIG. 6 is a flow chart for illustrating a method for fabricating an array substrate in an exemplary embodiment;

DETAILED DESCRIPTION OF EMBODIMENTS

To make the objects, the technical solutions and the advantages of embodiments of the present disclosure more apparent, the technical solutions of the embodiments of the present disclosure will be described in detail hereinafter in conjunction with the drawings of the exemplary embodiments.

During forming data line leads on a source and drain layer of an array substrate, the source and drain layer is usually patterned by dry etching like plasma etching to form the data line leads. However, the data line leads are usually not formed in a region close to an edge of the array substrate. Plasma bombarding the source and drain layer in this edge region tends to further affect the data lines which are close to this edge region and need to be retained. This may cause a problem in that data lines close to the edge region of the array substrate become too thin, thus resulting in data lines that are prone to break.

Figure 1:
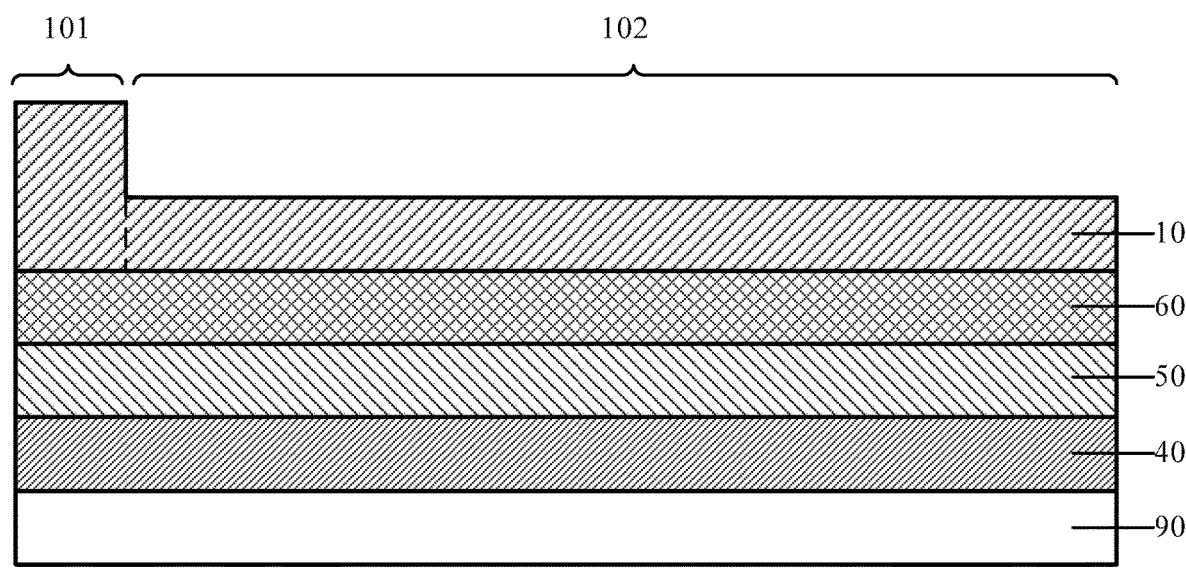
FIG. 1 is a structural view for illustrating an array substrate in an exemplary embodiment.
Figure 2:
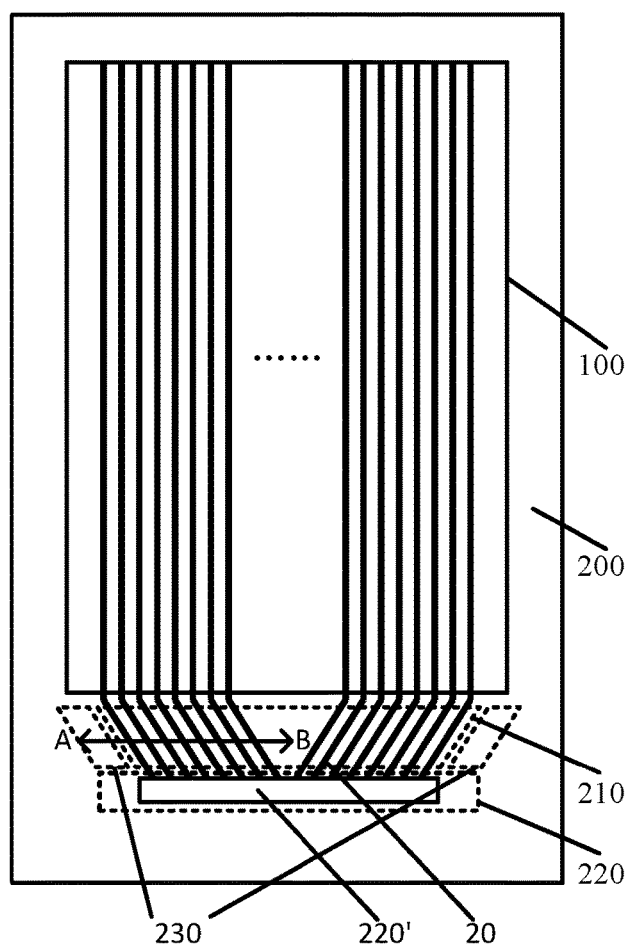
FIG. 2 is a view for illustrating regional distribution of a fanout region of an array substrate in an exemplary embodiment.

In a first aspect of exemplary embodiments, there is provided an array substrate. FIG. 1 is a schematic cross-sectional view for an array substrate in an embodiment of the present disclosure, and FIG. 2 is a schematic top view of the array substrate. The cross-sectional view of FIG. 1 is formed by cutting along a line A-B in FIG. 2.

As shown in FIG. 2, the array substrate for example comprises a display region 100 and a peripheral region 200 surrounding the display region. The peripheral region 200 comprises a data line lead region 210 and a driving circuit region 220. The data line lead region 210 lies between the driving circuit region 220 and the display region 100.

The driving circuit region 220 for example comprises a driving circuit 220'. The data line lead region 210 comprises a plurality of data line leads 20, and these data line leads 20 extend from the display region 100 and are electrically connected with the driving circuit 220' in the driving circuit region 220. The data line lead region 210 comprises peripheral data line leads, a region 230 of the peripheral region 200 close to peripheral data line leads comprises at least one retaining wall 101, and the at least one retaining wall is configured to prevent plasma from affecting the peripheral data line leads.

As shown in FIG. 2, the data line lead region 210 comprises a first border, a second border, a third border, and a fourth border. The first border is opposite to the second border. For example, the first border and the second border are an upper border and a lower border of the data line lead region 210 in FIG. 2, respectively. The third border is opposite to the fourth border. For example, the third border and the fourth border are a left border and a right border of the data line lead region 210 in FIG. 2, respectively. Namely, the data line lead region 210 is adjacent with the display region 100 at the first border, adjacent with the driving circuit region 220 at the second border, and adjacent with the region 230 of the peripheral region 200 at the third border and the fourth border.

In the context of the present disclosure, the region 230 of the peripheral region 200 close to peripheral data line leads indicates a region of the peripheral region 200 close to the third border and the fourth border of the data line lead region 210.

It is noted that, in general, one array substrate only comprises one data line lead region. However, this does not mean that this technical solution is only applicable to the array substrate comprising only one data line lead region. It can be known that, in case there are two data line lead regions in the array substrate, the same technological problem occurs in the array substrate. In this case, this technical solution is applicable to both two data line lead regions. Of course, this technical solution is also applicable to a plurality of data line lead regions, which is not repeated here for simplicity.

In an exemplary embodiment, the at least one retaining wall comprises two retaining walls which are arranged oppositely. For example, as shown in FIG. 2, each of two regions 230 of the peripheral region 200 close to peripheral data line leads comprises one retaining wall 101.

In an exemplary embodiment, the array substrate comprises a base substrate 90 and an interlayer dielectric layer 10 on a side of the base substrate. As shown in FIG. 1, the retaining wall 101 is arranged in a same layer and made of a same material as the interlayer dielectric layer 10, and a height of the retaining wall 101 in a direction perpendicular to the base substrate 90 is larger than a height of the interlayer dielectric layer 10 in the direction perpendicular to the base substrate 90. As shown in FIG. 2, the retaining wall 101 lies in the region 230 of the peripheral region 200 which is adjacent with the left border of the data line lead region 210. A portion of the interlayer dielectric layer 10 in the data line lead region 210 is indicated by 102.

Optionally, FIG. 1 shows a layering structure that the array substrate usually has. The layering structure can comprise a light shield (LS) layer 40, a gate insulating (GI) layer 50, a gate layer 60, the interlayer dielectric layer 10, or the like. It is noted that, the layering structure of the array substrate is not limited to the above layering structure. Other layers (not shown) can be added as needed, for example, a base substrate, an active layer, a source and drain layer, a planarization layer, or the like. Optionally, any one or more of these layers can be selected as needed. Besides, the arrangement sequence is not limited to the arrangement sequence shown in FIG. 1. Thus, the protection scope shall not be limited to the layering structure shown in exemplary embodiments.

As can be seen from the above embodiments, in the array substrate of the present disclosure, the retaining wall 101 of the interlayer dielectric layer 10 in the region 230 of the data line lead region 210 is set to have a height larger than that of the portion 102 of the interlayer dielectric layer 10 in the data line lead region 210. In case a metallic layer is subsequently formed on the interlayer dielectric layer 10 (for forming data line leads), the metallic layer formed on the retaining wall 101 may be at a relatively high position, and the metallic layer on the remaining portion 102 may be at a relatively low position. During the process of patterning the metallic layer by dry etching of a plasma etching technique to form data line leads, since the retaining wall 101 of the interlayer dielectric layer 10 close to the edge of the array substrate is set to have a larger height, the retaining wall 101 can block plasma from sputtering in the horizontal direction during bombarding the metallic material with plasma. As a result of the sputtering in the horizontal direction, the data line leads close to the retaining wall 101 become too thin, thus causing breaking of data line leads. It is noted that, during dry etching such as plasma etching, certain gases are ionized by glow discharge to generate plasma, and the plasma bombards target, so that the metallic or non-metallic material is separated from the target to form the required pattern.

It is noted that FIG. 1 is a structural view for an array substrate in the fanout region. As for the structure of other portions of the array substrate, reference can be made to the existing structure, which is not repeated here for simplicity.

Figure 3:
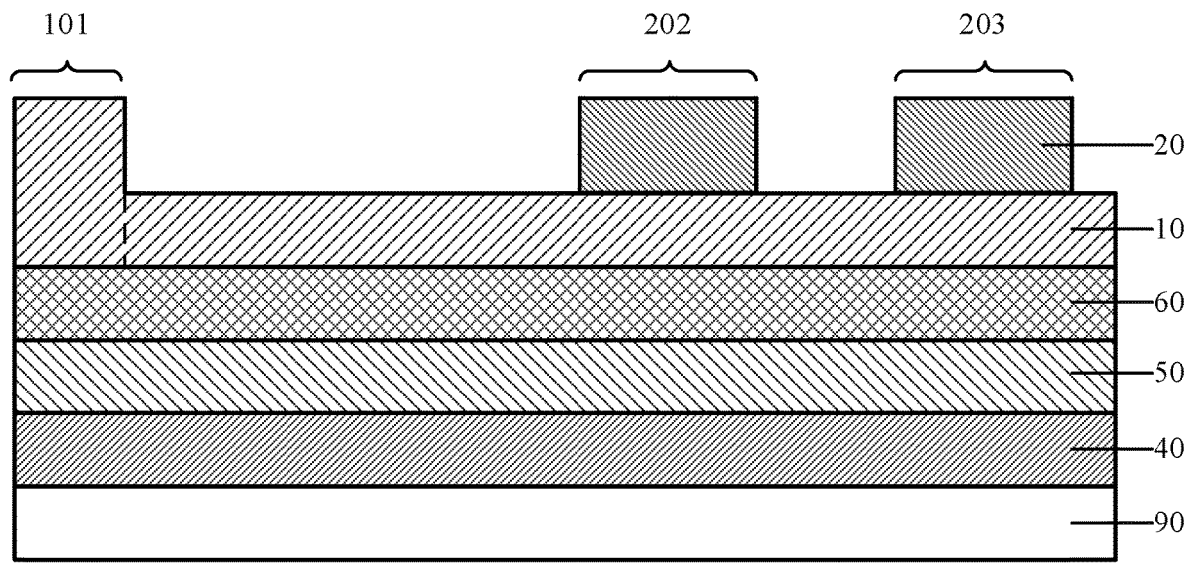
FIG. 3 is a structural view for illustrating an array substrate in another exemplary embodiment.

The present disclosure further provides another exemplary embodiment of an array substrate which can improve the yield. FIG. 3 is a structural view for an array substrate in another exemplary embodiment. In this embodiment, the data line leads 20 are arranged on a surface of the interlayer dielectric layer 10 away from the base substrate 90, and the height of the retaining wall 101 in the direction perpendicular to the base substrate is not smaller than a sum of the height of the interlayer dielectric layer 10 and the height of the data line leads 20 in the direction perpendicular to the base substrate.

As shown in FIG. 3, the array substrate further comprises the data line leads 20. The data line leads 20 are formed on the remaining portion 102 of the interlayer dielectric layer 10. The interlayer dielectric layer (ILD) 10 with a high edge can be effectively used to protect the data line leads close to the edge from being overetched. As a result, during the process of patterning the metallic layer by dry etching to form data line leads, since the retaining wall 101 of the interlayer dielectric layer 10 close to the edge of the array substrate is set to have a larger height, the retaining wall 101 can block plasma from sputtering in the horizontal direction to the remaining portion 102 during bombarding the metallic material with plasma. As a result of the sputtering in the horizontal direction, the data line leads close to the retaining wall 101 (for example the data line leads 202) become too thin, thus causing breaking of data line leads.

In some exemplary embodiments, a difference between thicknesses of the retaining wall 101 and the remaining portion 102 is larger than the thickness of the data line leads 20. This can effectively prevent plasma from sputtering in the horizontal direction to the remaining portion 102, and can further prevent the data line leads from becoming too thin.

It is noted that in the context of the present disclosure, the expression "the thickness of the retaining wall" is equivalent to and exchangeable with the expression "the height of the retaining wall" in a direction perpendicular to the base substrate.

Figure 4:
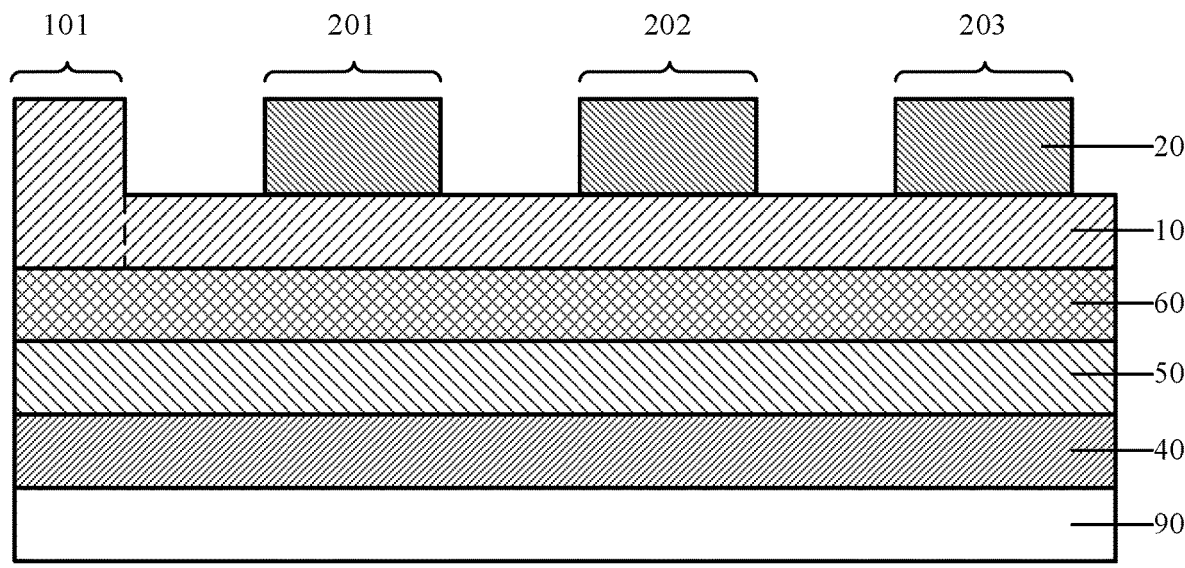
FIG. 4 is a structural view for illustrating an array substrate in yet another exemplary embodiment.

Optionally, FIG. 4 shows yet another exemplary embodiment of the array substrate. The data line leads 20 comprise effective wires 202, 203 and a dummy SD (dummy wire) 201. The dummy SD 201 lies between the effective wire 202 and the retaining wall 101. The dummy SD 201 does not operate, and can further block plasma from affecting the operating effective wires 202 and 203 during dry etching.

Optionally, the effective wires 202, 203 and the dummy SD 201 of the data line leads 20 in the fanout region have a same width. This can provide the required blocking effect without increasing the process complexity.

In another exemplary embodiment, FIG. 3 shows a layering structure that the array substrate usually has. The layering structure can comprise a light shield layer 40, a gate insulating (GI) layer 50, a gate layer 60, the interlayer dielectric layer 10, or the like. It is noted that, the layering structure of the array substrate is not limited to the above layering structure. Other layers (not shown) can be added as needed, for example, a base substrate, an active layer, a source and drain layer, a planarization layer, or the like. Optionally, any one or more of these layers can be selected as needed. Besides, the arrangement sequence is not limited to the arrangement sequence shown in FIG. 3. Thus, the protection scope shall not be limited to the layering structure shown in the exemplary embodiments.

In an exemplary embodiment, the array substrate comprises the base substrate 90, the interlayer dielectric layer 10 on a side of the base substrate 90, and the gate layer 60 between the base substrate 90 and the interlayer dielectric layer 10. The retaining wall 101 is arranged in a same layer and made of a same material as the gate layer 60, and a sum of the height of the interlayer dielectric layer 10 and the height of the retaining wall 101 in the direction perpendicular to the base substrate is larger than a sum of the height of the interlayer dielectric layer 10 and the height of the gate layer 60 in the direction perpendicular to the base substrate.

In an exemplary embodiment, the array substrate comprises the base substrate 90, and the gate insulating layer 50, the gate layer 60, and the interlayer dielectric layer 10 which are arranged away from the base substrate 90 in this order. The retaining wall 101 is arranged in a same layer and made of a same material as the gate insulating layer 50. A sum of the height of the interlayer dielectric layer 10, the height of the gate layer 60 and the height of the retaining wall 101 in the direction perpendicular to the base substrate is larger than a sum of the height of the interlayer dielectric layer 10, the height of the gate layer 60, and the height of the gate insulating layer 50 in the direction perpendicular to the base substrate.

In an exemplary embodiment, the array substrate comprises the base substrate 90, and the light shield layer 40, the gate insulating layer 50, the gate layer 60, and the interlayer dielectric layer 10 which are arranged away from the base substrate 90 in this order. The retaining wall 101 is arranged in a same layer and made of a same material as the light shield layer 40. A sum of the height of the interlayer dielectric layer 10, the height of the gate layer 60, the height of the gate insulating layer 50, and the height of the retaining wall 101 in the direction perpendicular to the base substrate is larger than a sum of the height of the interlayer dielectric layer 10, the height of the gate layer 60, the height of the gate insulating layer 50, and the height of the light shield layer 40 in the direction perpendicular to the base substrate.

As can be seen from the above embodiments, in the array substrate of the present disclosure, the retaining wall 101 of the interlayer dielectric layer 10 is set to have a thickness larger than the thickness of the remaining portion 102. In case a metallic layer is subsequently formed on the interlayer dielectric layer 10 (for forming data line leads), the metallic layer formed on the retaining wall 101 may be at a relatively high position, and the metallic layer on the remaining portion 102 may be at a relatively low position. During the process of patterning the metallic layer by dry etching to form data line leads, since the retaining wall 101 of the interlayer dielectric layer 10 close to the edge of the array substrate is set to have a larger height, during bombarding the metallic material with plasma, the retaining wall 101 can block plasma from sputtering in the horizontal direction. The horizontal direction sputtering causes the data line leads close to the retaining wall 101 to become too thin, thus causing breaking of data line leads.

It is noted that FIG. 3 is a structural view for an array substrate in the fanout region. As for the structure of other portions of the array substrate, reference can be made to the existing structure, which is not repeated here for simplicity.

Figure 5:
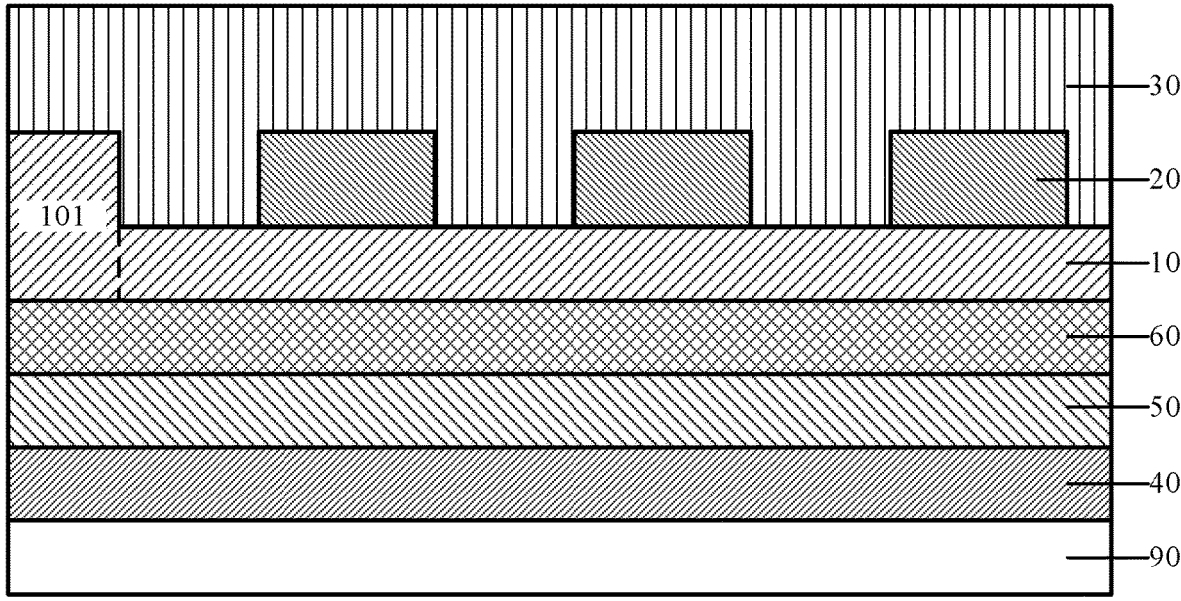
FIG. 5 is a structural view for illustrating an array substrate in yet another exemplary embodiment.

The present disclosure further provides yet another exemplary embodiment of an array substrate which can improve the yield. FIG. 5 is a structural view for an array substrate in yet another exemplary embodiment of the present disclosure.

As shown in FIG. 5, a planarization layer 30 is formed on the data line leads 20. The planarization layer fills and levels up the array substrate, so that the thickened region of the interlayer dielectric layer has no effect on the flatness of the array substrate.

It is noted that FIG. 5 is a structural view for an array substrate in the fanout region. As for the structure of other portions of the array substrate, reference can be made to the existing structure, which is not repeated here for simplicity.

Optionally, in any of the above exemplary embodiments, the space between the retaining wall 101 and the data lines lead 20 (for example dummy SD) adjacent with the retaining wall 101 equals to the space between the neighboring data line leads 20, so that the arrangement structure of data line leads within the wire region of the fanout region can be simulated between the retaining wall 101 and the data line leads 20 adjacent with the retaining wall 101, so as to obtain the optimal blocking effect.

In an exemplary embodiment, the space between the retaining wall 101 and the data line leads 20 adjacent with the retaining wall 101 is about 2.0 μm~2.5 μm.

Optionally, in any of the above exemplary embodiments, the retaining wall 101 has a width of 2.5 μm~20 μm so as to more effectively avoid the problem that the dummy SD and the adjacent SD wires become too thin due to over exposure, and to effectively avoid overetching due to particle bouncing during dry etching.

For example, in any of the above exemplary embodiments, the retaining wall 101 has a width of 2.5 μm. Since the effective wires usually have a width of about 2.5 μm, the structure surrounding the dummy SD can be simulated as the structure surrounding internal effective wires, so that dummy SDs and SD wires with improved uniformity can be obtained in the wire region of the fanout region.

In another exemplary embodiment, there is provided a method for fabricating an array substrate which can improve the yield. In FIG. 6, a flow chart for a method for fabricating an array substrate in an exemplary embodiment is shown.

The method for fabricating an array substrate according to an exemplary embodiment comprises the following step.

Step 901: forming at least one retaining wall in a region of a peripheral region of an array substrate close to peripheral data line leads, wherein the at least one retaining wall is configured to prevent plasma from affecting the peripheral data line leads.

Figure 8A:
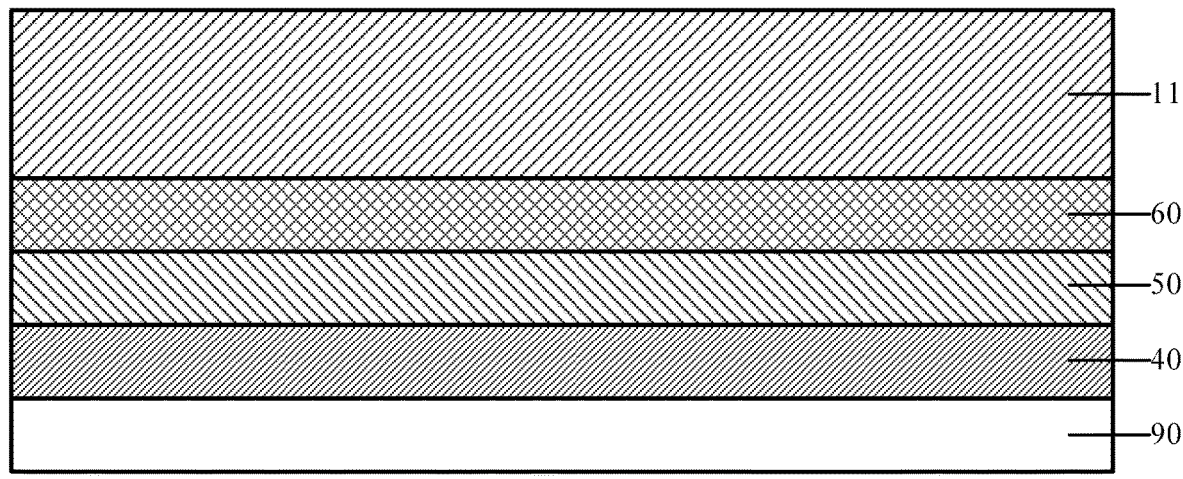
FIG. 8a is a structural view for illustrating an array substrate in an exemplary embodiment of a method for fabricating an array substrate of the present disclosure, in which an interlayer dielectric thin film has been formed.
Figure 8B:
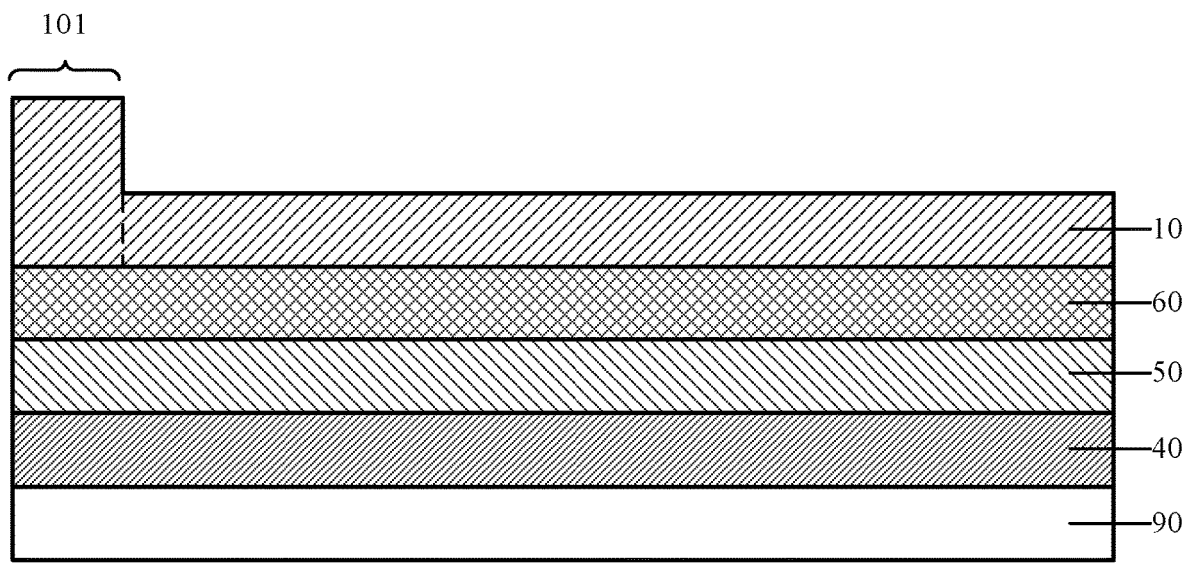
FIG. 8b is a structural view for illustrating an array substrate in an exemplary embodiment of a method for fabricating an array substrate of the present disclosure, in which an interlayer dielectric layer has been formed.

For example, during forming the interlayer dielectric layer 10 shown in FIG. 2 (as shown in FIG. 8b), the interlayer dielectric layer 10 comprises the retaining wall 101 and the remaining portion 102, the retaining wall 101 has a thickness larger than the thickness of the remaining portion 102. The retaining wall 101 is arranged in the region 230 of the peripheral region 200 of the array substrate close to the peripheral data line leads, and the remaining portion 102 is arranged in the data line lead region 210 of the array substrate (as shown in FIG. 2).

In some exemplary embodiments, the array substrate can have a layering structure that the array substrate usually has. As shown in FIG. 1, the layering structure can comprise the light shield layer 40, a gate insulating (GI) layer 50, a gate layer 60, the interlayer dielectric layer 10, or the like. It is noted that, the layering structure of the array substrate is not limited to the above layering structure. Other layers (not shown) can be added as needed, for example, a base substrate, an active layer, a source and drain layer, a planarization layer, or the like. Optionally, any one or more of these layers can be selected as needed. Besides, the arrangement sequence is not limited to the arrangement sequence shown in FIG. 1. Thus, the protection scope shall not be limited to the layering structure shown in the exemplary embodiments.

As can be seen from the above embodiments, in the method for fabricating an array substrate of the present disclosure, the retaining wall 101 of the interlayer dielectric layer 10 is set to have a thickness larger than the thickness of the remaining portion 102. In case a metallic layer is subsequently formed on the interlayer dielectric layer 10 (for forming data line leads), the metallic layer formed on the retaining wall 101 may be at a relatively high position, and the metallic layer on the remaining portion 102 may be at a relatively low position. During the process of patterning the metallic layer by dry etching to form data line leads, since the retaining wall 101 of the interlayer dielectric layer 10 close to the edge of the array substrate is set to have a larger height, during bombarding the metallic material with plasma, the retaining wall 101 can block plasma from sputtering in the horizontal direction. The horizontal direction sputtering causes the data line leads close to the retaining wall 101 to become too thin, thus causing breaking of data line leads.

Figure 7:
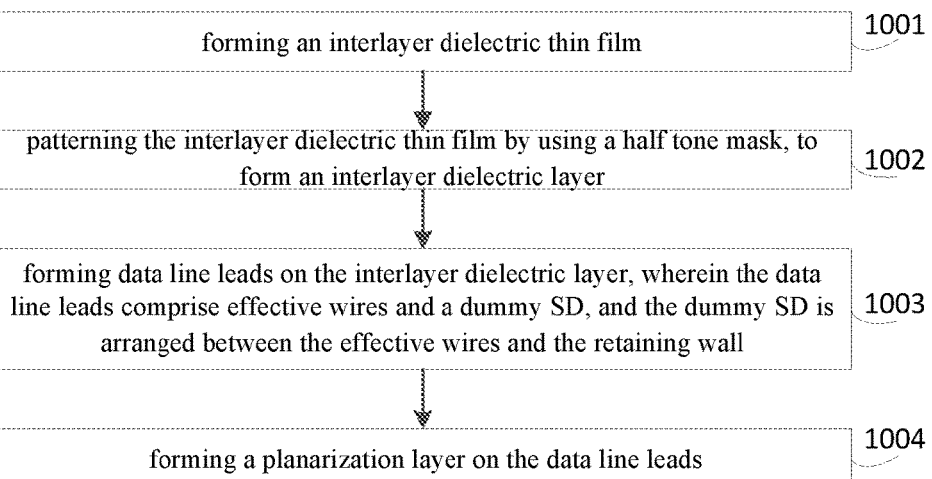
FIG. 7 is a flow chart for illustrating a method for fabricating an array substrate in another exemplary embodiment.

The present disclosure further provides another exemplary embodiment of a method for fabricating an array substrate which can improve the yield. In FIG. 7, a flow chart for a method for fabricating an array substrate in another embodiment of the present disclosure is shown.

The method for fabricating an array substrate comprises the following steps:

Step 1001: forming an interlayer dielectric thin film 11, as shown in FIG. 8a.

Step 1002: patterning the interlayer dielectric thin film 11 by using a half tone mask, to form the interlayer dielectric layer 10 (as shown in FIG. 8b); wherein the interlayer dielectric layer 10 comprises the retaining wall 101 and the remaining portion 102, the retaining wall 101 has a thickness larger than the thickness of the remaining portion 102, the retaining wall 101 lies in the region 230 of the peripheral region 200 of the array substrate close to peripheral data line leads, and the remaining portion 102 lies in the data line lead region 210 of the array substrate (as shown in FIG. 2). By forming the interlayer dielectric layer with the half tone mask, the process can be simplified, and the uniformity can be improved.

Figure 8C:
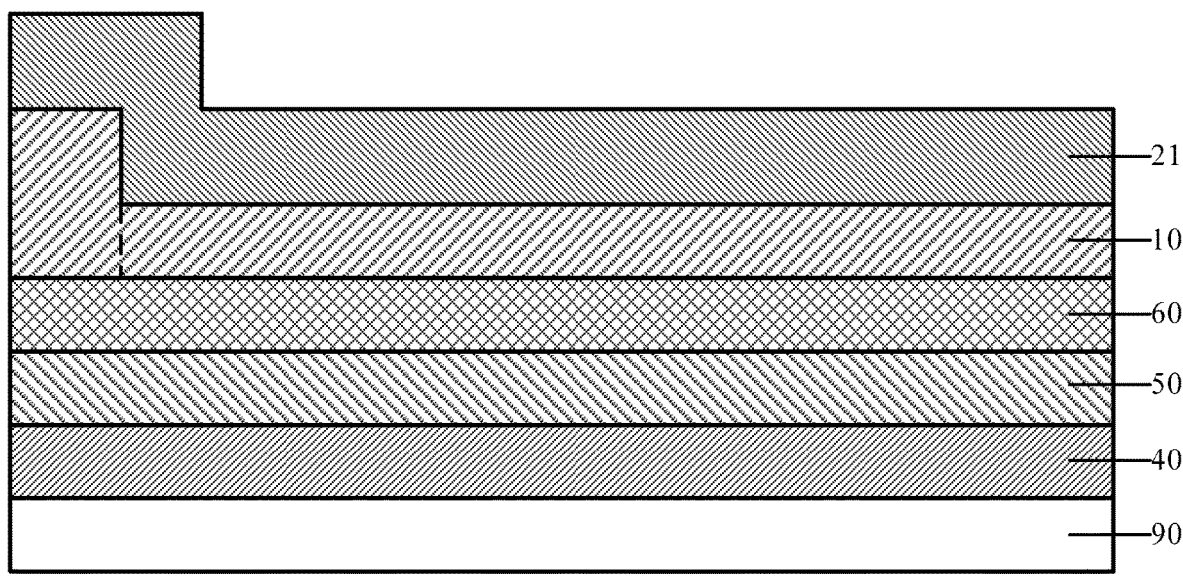
FIG. 8c is a structural view for illustrating an array substrate in an exemplary embodiment of a method for fabricating an array substrate of the present disclosure, in which a metallic layer has been formed.
Figure 8D:
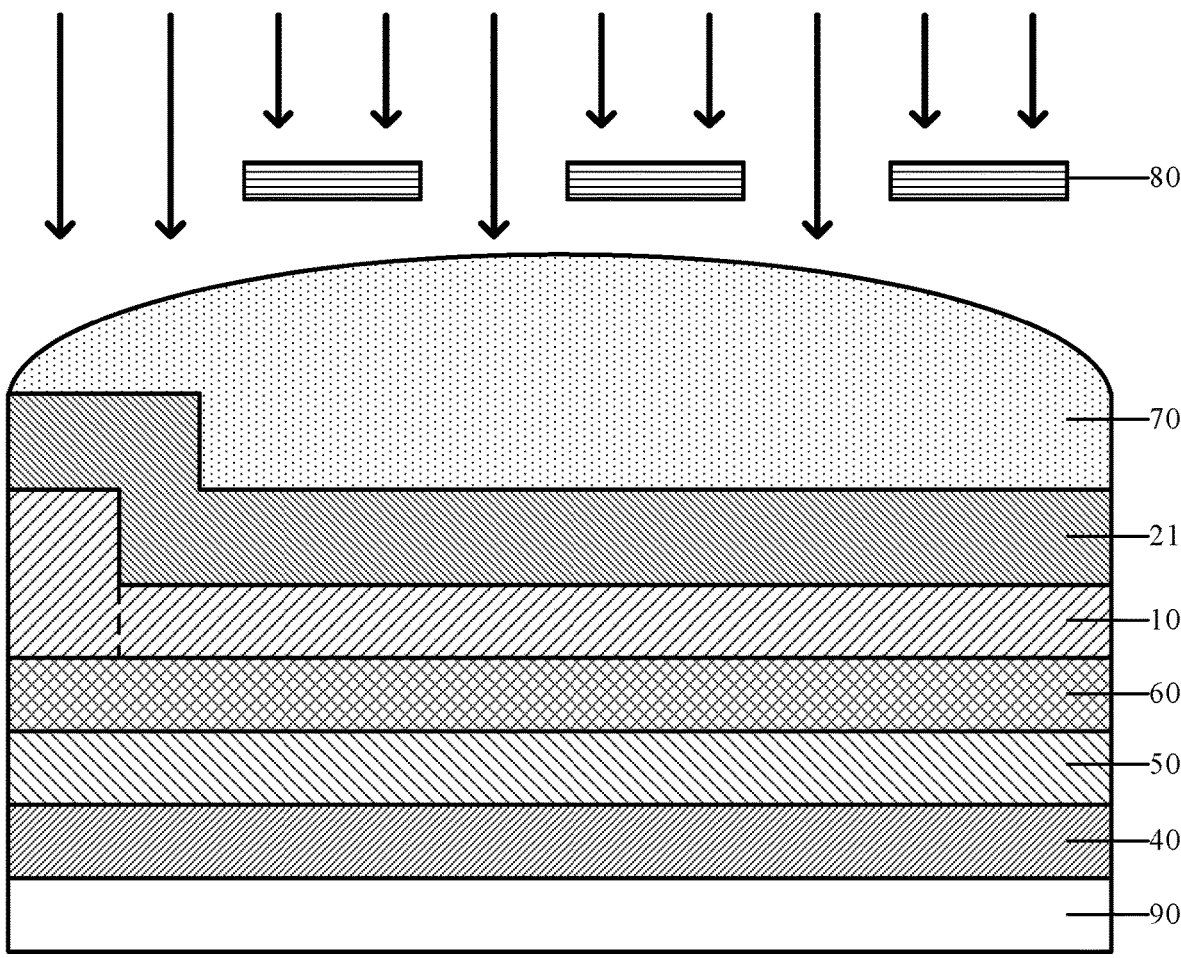
FIG. 8d is a structural view for illustrating array substrate in an exemplary embodiment of a method for fabricating an array substrate of the present disclosure, in which a photoresist layer is being exposed.
Figure 8E:
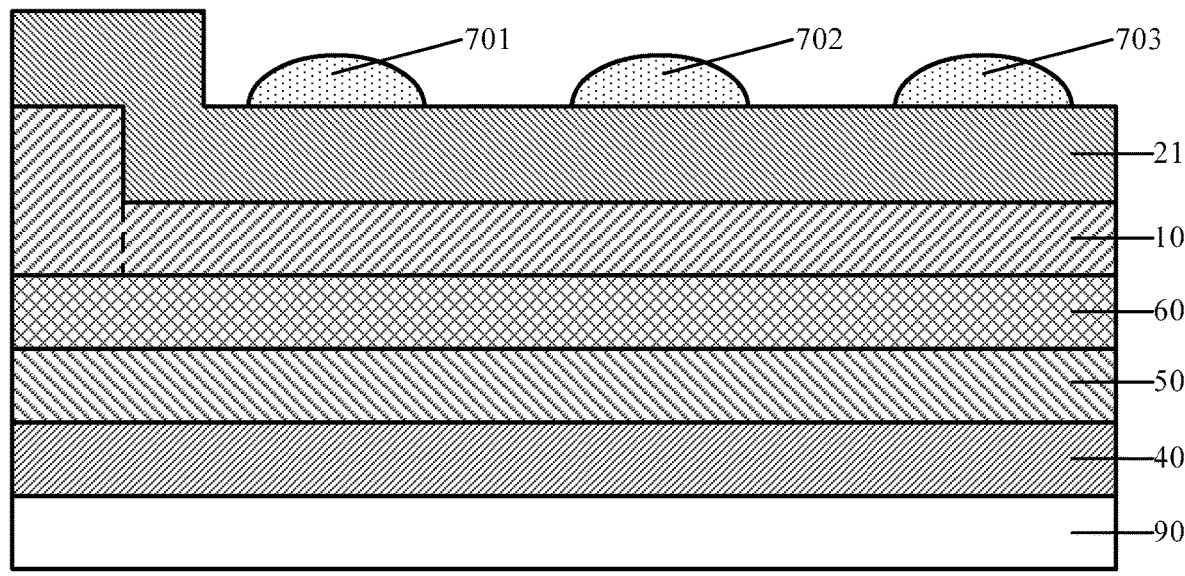
FIG. 8e is a structural view for illustrating an array substrate in an exemplary embodiment of a method for fabricating an array substrate of the present disclosure, in which the photoresist layer has been developed.
Figure 8F:
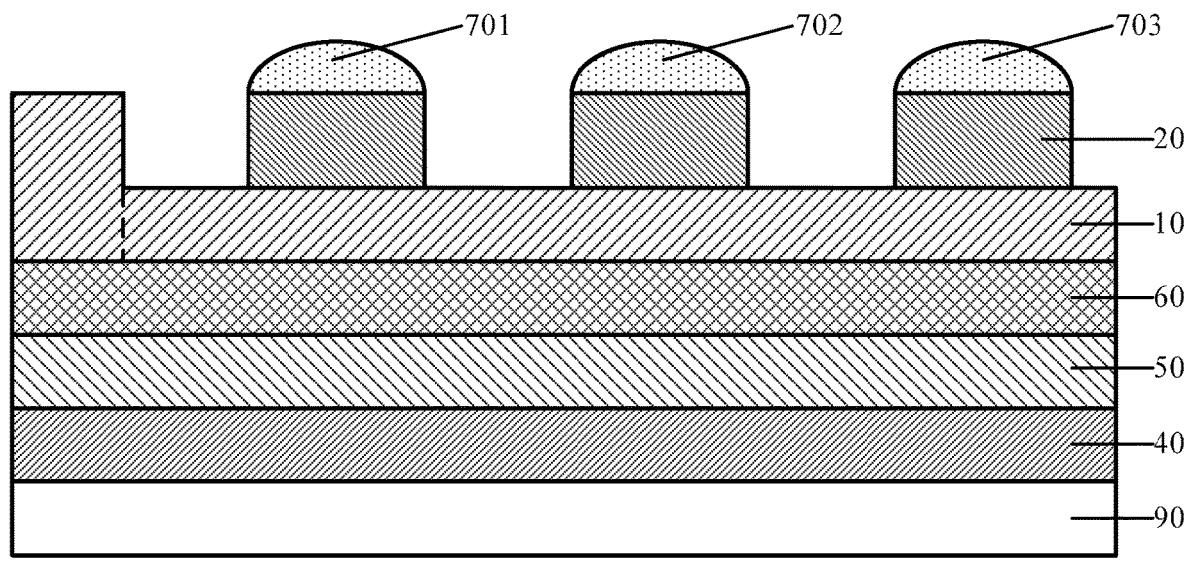
FIG. 8f is a structural view for illustrating an array substrate in an exemplary embodiment of a method for fabricating an array substrate of the present disclosure, in which the metallic layer has been etched to form data line leads.
Figure 8G:
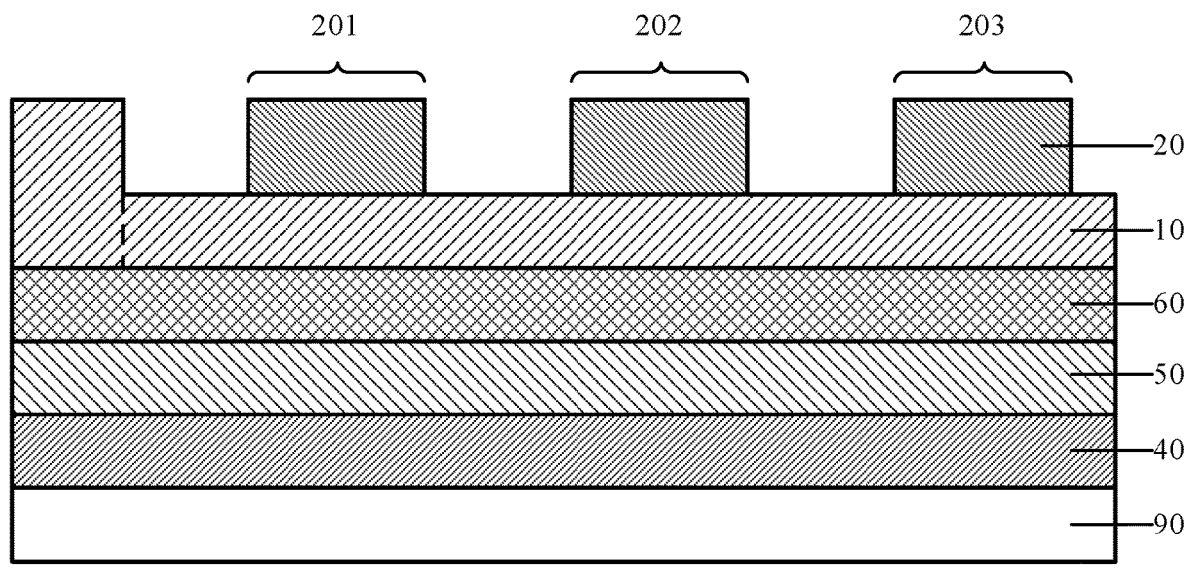
FIG. 8g is a structural view for illustrating an array substrate in an exemplary embodiment of a method for fabricating an array substrate of the present disclosure, in which the photoresist has been removed.

In another exemplary embodiment, the method for fabricating an array substrate can further comprise the following steps:

Step 1003: forming data line leads 20 on the interlayer dielectric layer 10, as shown in FIG. 8g, wherein the data line leads 20 comprise effective wires 202, 203 and a dummy SD 201. The dummy SD is arranged between the effective wires and the retaining wall. The dummy SD does not operate, and can further block plasma from affecting the operating effective wires during dry etching.

For example, in the data line leads 20 formed by the above method, the effective wires 202, 203 and the dummy SD 201 has a same width, so that both the effective wires 202, 203 and the dummy SD 201 can implement their functions more effectively.

In exemplary embodiments, forming the data line leads 20 on the interlayer dielectric layer 10 can be implemented by the following step:

forming a metallic thin film 21 (as shown in FIG. 8c), and patterning the metallic thin film to form a pattern comprising the data line leads 201, 202, 203 (as shown in FIG. 8g).

In some exemplary embodiments, the metallic thin film 21 usually can be formed by one or more of deposition, coating, and sputtering.

A patterning process suitable for a typical masking process usually comprises coating photoresist to form a photoresist layer 70, exposing with a mask 80 (as shown in FIG. 8d), developing to form photoresist 701, 702, 703 which acts as an anti-etching layer (as shown in FIG. 8e), etching the metallic thin film 21 to form data line leads 201, 202, 203 (as shown in FIG. 8f), and peeling off the photoresist (as shown in FIG. 8g).

In some cases, a pattern can be formed by a process other than the conventional patterning process, e.g., by a lifting-off technology. In addition, in some cases, a pattern can further be formed without a mask, e.g., by printing or other patterning processes. Namely, a process which can form the required pattern can be referred to as a patterning process.

Figure 8H:
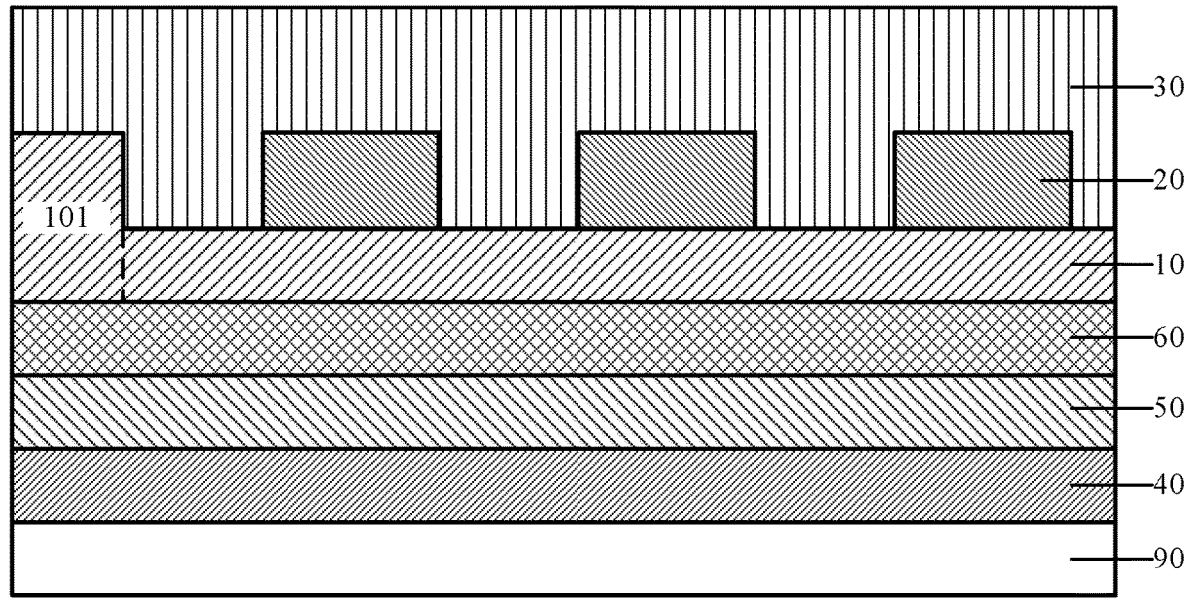
FIG. 8h is a structural view for illustrating an array substrate in an exemplary embodiment of a method for fabricating an array substrate of the present disclosure, in which a planarization layer has been formed.

In certain exemplary embodiments, the method for fabricating an array substrate can further comprise the following step:

Step 1004: forming the planarization layer 30 on the data line leads 20, as shown in FIG. 8h.

The planarization layer fills and levels up the array substrate, so that the thickened region of the interlayer dielectric layer has no effect on the flatness of the array substrate.

As can be seen from the above exemplary embodiments, in the method for fabricating an array substrate of the present disclosure, the retaining wall 101 of the interlayer dielectric layer 10 is set to have a thickness larger than the thickness of the remaining portion 102. In case a metallic layer is subsequently formed on the interlayer dielectric layer 10 (for forming data line leads), the metallic layer formed on the retaining wall 101 may be at a relatively high position, and the metallic layer on the remaining portion 102 may be at a relatively low position. During the process of patterning the metallic layer by dry etching to form data line leads, since the retaining wall 101 of the interlayer dielectric layer 10 close to the edge of the array substrate is set to have a larger height, during bombarding the metallic material with plasma, the retaining wall 101 can block plasma from sputtering in the horizontal direction, the horizontal direction sputtering causes the data line leads close to the retaining wall 101 to become too thin, thus causing breaking of data line leads. It is noted that, during dry etching such as plasma etching, certain gases are ionized by glow discharge to generate plasma, and the plasma bombards target, so that the metallic or non-metallic material is separated from the target to form the required pattern.

It is noted that, if necessary, the method for fabricating an array substrate as describes above can further comprise steps for forming other layers. The exemplary embodiments only provide examples, and this does not indicate that other essential layers or structures are excluded from the array substrate of the present disclosure.

In another exemplary embodiment, there is provided a display panel which can improve the yield.

The display panel comprises the array substrate in any one of the above embodiments.

In another exemplary embodiment, there is provided a display device which can improve the yield.

The display device comprises the display panel as described above.

It is noted that, the display device in exemplary embodiments can be any product or component with a display function, such as electronic paper, cell phone, tablet computer, TV set, laptop computer, digital photo frame, and navigator.

Exemplary embodiments of the present disclosure provide an array substrate, a method for fabricating the same, a display panel, and a display device. The retaining wall of the interlayer dielectric layer is set to have a thickness larger than the thickness of a second portion. In case a metallic layer is subsequently formed on the interlayer dielectric layer (for forming data line leads), the metallic layer formed on the retaining wall may be at a relatively high position, and the metallic layer on the second portion may be at a relatively low position. During the process of patterning the metallic layer by dry etching to form data line leads, since the retaining wall of the interlayer dielectric layer close to the edge of the array substrate is set to have a larger height, the retaining wall can block plasma from sputtering in the horizontal direction during bombarding the metallic material with plasma. As a result of the sputtering in the horizontal direction, the data line leads close to the retaining wall become too thin, thus causing breaking of data line leads.

It is noted that, the operation for forming a layer as described comprises, but not limited to (chemical, physical) deposition, (magnetron) sputtering. A person of ordinary skill can understand that, after formation of each layer, a corresponding pattern can further be form thereon as needed, which is not repeated here for simplicity.

It is noted that the size of a layer or region in the drawings may be exaggerated for clarity. It can be understood that when an element or layer is referred to as being "on" another element or layer, it can be directly on the other element or layer or one or more intervening elements or layers may be present. It can be understood that when an element or layer is referred to as being "below" another element or layer, it can be directly below the other element or layer or one or more intervening elements or layers may be present. It can be understood that when an element or layer is referred to as being "between" two elements or layers, it can be the unique layer between these two elements or layers or one or more intervening elements or layers may be present. Like numbers refer to like elements throughout.

In the present disclosure, the terms "first", "second", "third", "fourth" are only for the purpose of describing, and shall not be construed to indicate or imply relative importance. Unless otherwise defined, the term "a plurality of" means two or more.

A person of ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also encompasses these modifications and variations.

What is claimed is:

1. An array substrate, comprising a display region and a peripheral region surrounding the display region,
wherein the peripheral region comprises a data line lead region and a driving circuit region, and the data line lead region is between the driving circuit region and the display region;
wherein the driving circuit region comprises a driving circuit, the data line lead region comprises a plurality of data line leads, and the plurality of data line leads extend from the display region and are electrically connected with the driving circuit; and
wherein the data line lead region comprises peripheral data line leads, a region of the peripheral region close to the peripheral data line leads comprises at least one retaining wall configured to prevent plasma from affecting the peripheral data line leads, and an orthographic projection of the at least one retaining wall on the array substrate and an orthographic projection of the plurality of data line leads and the peripheral data line leads on the array substrate do not overlap.

2. The array substrate of claim 1, wherein the at least one retaining wall comprises two retaining walls which are arranged oppositely.

3. The array substrate of claim 1, further comprising a base substrate and an interlayer dielectric layer on a side of the base substrate,
wherein the retaining wall is arranged in a same layer and made of a same material as the interlayer dielectric layer, and a height of the retaining wall in a direction perpendicular to the base substrate is larger than a height of the interlayer dielectric layer in the direction perpendicular to the base substrate.

4. The array substrate of claim 3, wherein the data line leads are arranged on a surface of the interlayer dielectric layer away from the base substrate, and the height of the retaining wall in the direction perpendicular to the base substrate is not smaller than a sum of the height of the interlayer dielectric layer and a height of the data line leads in the direction perpendicular to the base substrate.

5. The array substrate of claim 3, further comprising a dummy SD, wherein the dummy SD is arranged on a side of the interlayer dielectric layer away from the base substrate, and the dummy SD is between the retaining wall and the data line leads.

6. The array substrate of claim 5, wherein a space between the retaining wall and the dummy SD equals to a space between the data line leads.

7. The array substrate of claim 5, wherein a space between the retaining wall and the dummy SD is about 2.0 μm~2.5 μm.

8. The array substrate of claim 1, further comprising a base substrate, an interlayer dielectric layer on a side of the base substrate, and a gate layer between the base substrate and the interlayer dielectric layer, wherein the retaining wall is arranged in a same layer and made of a same material as the gate layer, and a sum of a height of the interlayer dielectric layer and a height of the retaining wall in the direction perpendicular to the base substrate is larger than a sum of the height of the interlayer dielectric layer and a height of the gate layer in the direction perpendicular to the base substrate.

9. The array substrate of claim 1, further comprising a base substrate, and a gate insulating layer, a gate layer, and an interlayer dielectric layer which are arranged away from the base substrate in this order, wherein the retaining wall is arranged in a same layer and made of a same material as the gate insulating layer, and a sum of a height of the interlayer dielectric layer, a height of the gate layer, and a height of the retaining wall in the direction perpendicular to the base substrate is larger than a sum of the height of the interlayer dielectric layer, the height of the gate layer, and a height of the gate insulating layer in the direction perpendicular to the base substrate.

10. The array substrate of claim 1, further comprising a base substrate, and a light shield layer, a gate insulating layer, a gate layer, and an interlayer dielectric layer which are arranged away from the base substrate in this order, wherein the retaining wall is arranged in a same layer and made of a same material as the light shield layer, and the sum of a height of the interlayer dielectric layer, a height of the gate layer, a height of the gate insulating layer and a height of the retaining wall perpendicular to the base substrate is larger than the sum of the height of the interlayer dielectric layer, the height of the gate layer, the height of the gate insulating layer, and a height of the light shield layer perpendicular to the base substrate.

11. The array substrate of claim 1, wherein the retaining wall has a width of about 2.5 μm~20 μm.

12. The array substrate of claim 1, wherein the retaining wall has a width of about 2.5 μm, and the data line leads have a width of 2.5 μm.

13. A display panel, comprising the array substrate of claim 1.

14. A display device, comprising the array substrate of claim 1.

15. A method for fabricating an array substrate,
wherein the array substrate comprises a display region and a peripheral region surrounding the display region,
wherein the peripheral region comprises a data line lead region and a driving circuit region, and the data line lead region is between the driving circuit region and the display region;
wherein the driving circuit region comprises a driving circuit, the data line lead region comprises a plurality of data line leads, and the plurality of data line leads extend from the display region and are electrically connected with the driving circuit;
wherein the data line lead region comprises peripheral data line leads, and the method comprises: forming at least one retaining wall in a region of the peripheral region close to the peripheral data line leads, wherein the at least one retaining wall is configured to prevent plasma from affecting the peripheral data line leads, and an orthographic projection of the at least one retaining wall on the array substrate and an orthographic projection of the plurality of data line leads and the peripheral data line leads on the array substrate do not overlap.

16. The method of claim 15, wherein the step of forming at least one retaining wall in the region of the peripheral region close to the peripheral data line leads comprises: forming two retaining walls which are arranged oppositely, in the region of the peripheral region close to the peripheral data line leads.

17. The method of claim 15, wherein the step of forming at least one retaining wall in the region of the peripheral region close to the peripheral data line leads comprises:
preparing a base substrate,
forming an interlayer dielectric thin film on the base substrate, and
patterning the interlayer dielectric thin film by using a half tone mask, to form the retaining wall and an interlayer dielectric layer, wherein a height of the retaining wall in a direction perpendicular to the base substrate is larger than a height of the interlayer dielectric layer in the direction perpendicular to the base substrate.

18. The method of claim 17, further comprising:
forming the data line leads on a surface of the interlayer dielectric layer away from the base substrate, wherein the height of the retaining wall in the direction perpendicular to the base substrate is not smaller than a sum of the height of the interlayer dielectric layer and a height of the data line leads in the direction perpendicular to the base substrate.

19. The method of claim 15, the step of forming at least one retaining wall in the region of the peripheral region close to the peripheral data line leads comprises:
preparing a base substrate,
forming a gate thin film on the base substrate,
patterning the gate thin film by using a half tone mask, to form the retaining wall and a gate layer, and
forming an interlayer dielectric layer on the retaining wall and the gate layer, wherein a sum of a height of the interlayer dielectric layer and a height of the retaining wall in a direction perpendicular to the base substrate is larger than a sum of the height of the interlayer dielectric layer and a height of the gate layer in the direction perpendicular to the base substrate.

20. The method of claim 15, wherein the step of forming at least one retaining wall in the region of the peripheral region close to the peripheral data line leads comprises:
preparing a base substrate,
forming a gate insulating thin film on the base substrate,
patterning the gate insulating thin film by using a half tone mask, to form the retaining wall and the gate insulating layer, and
forming a gate layer and an interlayer dielectric layer in this order on the retaining wall and the gate insulating layer, wherein a sum of a height of the interlayer dielectric layer, a height of the gate layer, and a height of the retaining wall in the direction perpendicular to the base substrate is larger than a sum of the height of the interlayer dielectric layer, the height of the gate layer, and a height of the gate insulating layer in the direction perpendicular to the base substrate.

* * * * *